United States Patent [19]
Wideman et al.

[11] Patent Number: 5,274,339
[45] Date of Patent: Dec. 28, 1993

[54] GAIN COMPENSATION CIRCUIT

[75] Inventors: Gary A. Wideman, Goleta; Michael Baladjanian, Santa Barbara, both of Calif.

[73] Assignee: Raytheon Company, Lexington, Mass.

[21] Appl. No.: 936,985

[22] Filed: Aug. 27, 1992

[51] Int. Cl.⁵ .............................................. H03F 3/193
[52] U.S. Cl. .................................... 330/54; 330/277; 330/286; 330/304; 330/289; 333/28 R
[58] Field of Search ................. 330/54, 143, 277, 286, 330/289, 304; 333/28 R

[56] References Cited
U.S. PATENT DOCUMENTS

| | | | |
|---|---|---|---|
| 3,423,535 | 1/1969 | Hochgraf et al. | 333/28 X |
| 4,967,169 | 10/1990 | Sun et al. | 333/28 R |

*Primary Examiner*—James B. Mullins
*Attorney, Agent, or Firm*—William R. Clark; Richard M. Sharkansky

[57] ABSTRACT

A circuit for compensating for GaAs FET amplifier gain variations over a frequency band as a function of temperature. The circuit includes a passive equalizer circuit having a fixed gain over the frequency band and an active equalizer circuit having a gain which varies over the frequency band as a function of temperature. The passive and active equalizers are coupled in series. The active equalizer circuit comprises varactor diodes in a low pass filter arrangement with the bias voltage of the varactor being provided by an external driver controlled by a temperature sensitive thermistor. As the value of the varactor's junction capacitance is increased (as a function of the temperature controlled bias voltage), the cutoff frequency of the low pass filter decreases.

15 Claims, 3 Drawing Sheets

GAIN COMPENSATION CIRCUIT

BACKGROUND OF THE INVENTION

This invention relates generally to radio frequency amplifier circuits and more particularly to such circuits having means for compensating for a variations in gain over a given frequency range, such as may be caused by variations in temperature.

As is known in the art, FET amplifiers, often used in distributed amplifier circuits, commonly exhibit variations in gain as a function of frequency, as may be caused by temperature variations. More specifically, two types of gain variations occur. The first may be referred to as gain offset and is a phenomena in which the overall gain magnitude curve is offset upward or downward as a result of temperature variations. This type of gain variation is generally tolerable since it is readily compensated. The second type of gain variations with temperature are those which render the gain characteristic sloped within a given frequency band. This latter type of variation may be undesirable in cases where system requirements call for a "flat" input to output gain response (i.e. a gain response having zero slope) within the given frequency band. For example, requirements for ECM transmitters, receivers, and repeaters often require a flat gain response even with variations in temperature.

One way known in the art to compensate for gain variations caused by temperature changes, is to use an attenuator controlled by a thermistor network. A thermistor is a device having a resistance which varies in accordance with temperature. By controlling the attenuator with a thermistor network, the attenuation of the gain varies in accordance with temperature variations. However, this type of compensation adjusts, or more specifically, offsets the overall gain magnitude curve upward or downward in accordance with temperature and thus addresses the former type of gain variations. That is, the gain, along with its undesirable variations within a given frequency range, moves upward or downward. Thus, the resulting gain versus frequency curve remains sloped within the given frequency band as a result of temperature variations.

SUMMARY OF THE INVENTION

With the foregoing background in mind, it is an object of the present invention to provide a circuit for compensating for gain variations within a frequency band resulting from temperature variations which render the gain characteristic positively or negatively sloped.

It is a further object to provide a circuit for improving the flatness of the gain versus frequency curve of an amplifier circuit.

A further object is to provide an improved FET amplifier having a gain versus frequency slope of approximately zero.

Another object is to provide a method of maintaining constant the gain of a FET amplifier over a given or desired frequency range.

A still further object is to provide an improved distributed amplifier circuit having a substantially flat gain versus frequency response.

These and other objects are attained generally by providing a radio frequency circuit comprising at least one field effect transistor having an input electrode and an output electrode and gain compensation means coupled in series with the at least one field effect transistor. The gain compensation means comprises first means for providing a gain versus frequency characteristic having a fixed slope and second means, coupled in series with the first means, for providing a varying gain versus frequency characteristic in response to variations in temperature. In the preferred arrangement, the first means comprises a transmission line network and the second means includes a varactor diode.

With this arrangement, an improved FET amplifier is provided having a substantially flat gain versus frequency curve in response to variations in temperature. The composite gain characteristic of the amplifier circuit is provided by the graphical addition of the gain magnitude of the first means, the second means, and the at least one field effect transistor. The substantially flat composite gain characteristic is achieved by tailoring the gain characteristic of the first means to compensate for temperature caused gain variations at a first operating condition or temperature. Note that the effect of the second means on the composite gain characteristic of the circuit is negligible at such first operating temperature. At a second operating condition, or temperature, the effect of the second means on the composite gain characteristic of the circuit becomes significant and varies the composite gain in accordance with temperature variations. For example, in the preferred embodiment, the second means is provided so that its effect on the composite circuit gain is negligible at relatively high temperatures. Thus, the fixed slope of the gain characteristic of the first means compensates for temperature caused gain variations at such high temperature operating conditions since, here, such fixed slope is positive and the gain of the amplifier to be compensated has a negative slope at such high temperatures. At lower temperatures however, the effect of the second means on the composite gain characteristic becomes significant and varies such gain in accordance with temperature. The result is a radio frequency circuit having a substantially flat gain versus frequency response regardless of temperature.

In accordance with a further aspect of the invention, a distributed amplifier comprises a plurality of field effect transistors, each one having an input electrode and an output electrode, input propagation means for successively coupling the input electrodes of each one of the transistors to an input terminal, and output propagation means for successively coupling the output electrode of each one of the transistors to an intermediate terminal. Also provided is gain compensation means, disposed between the intermediate terminal and an output terminal. The gain compensation means comprises first means for providing a gain versus frequency characteristic having a fixed slope and second means for providing a varying gain versus frequency characteristic in response to variations in temperature.

With this arrangement, an improved distributed amplifier is provided having a relatively flat gain versus frequency characteristic. More specifically, here, the first means is designed to provide a frequency characteristic to compensate for gain variations under a first operating condition, when the effect of the second means on the composite gain versus frequency characteristic is negligible. Whereas, the second means significantly affects the gain characteristic of the amplifier in accordance with temperature variations at a second operating condition.

In accordance with a still further aspect of the invention, a method for compensating for temperature caused gain variations in an amplifier is provided including the steps of providing first means having a gain versus frequency characteristic with a fixed slope, providing second means having a varying gain versus frequency characteristic in response to variations in temperature, and coupling the first means, second means, and the amplifier in series. With this arrangement, the composite gain characteristic of the amplifier circuit is provided by the graphical addition of the gain magnitude curves associated with the first means, the second means, and the amplifier. The fixed slope of the gain characteristic of the first means is positive and compensates for the temperature caused gain variations at a first operating condition; whereas, the second means compensates for temperature caused gain variations at a second operating condition. Here, the first operating condition is a high temperature condition and the second operating condition is a low temperature condition.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
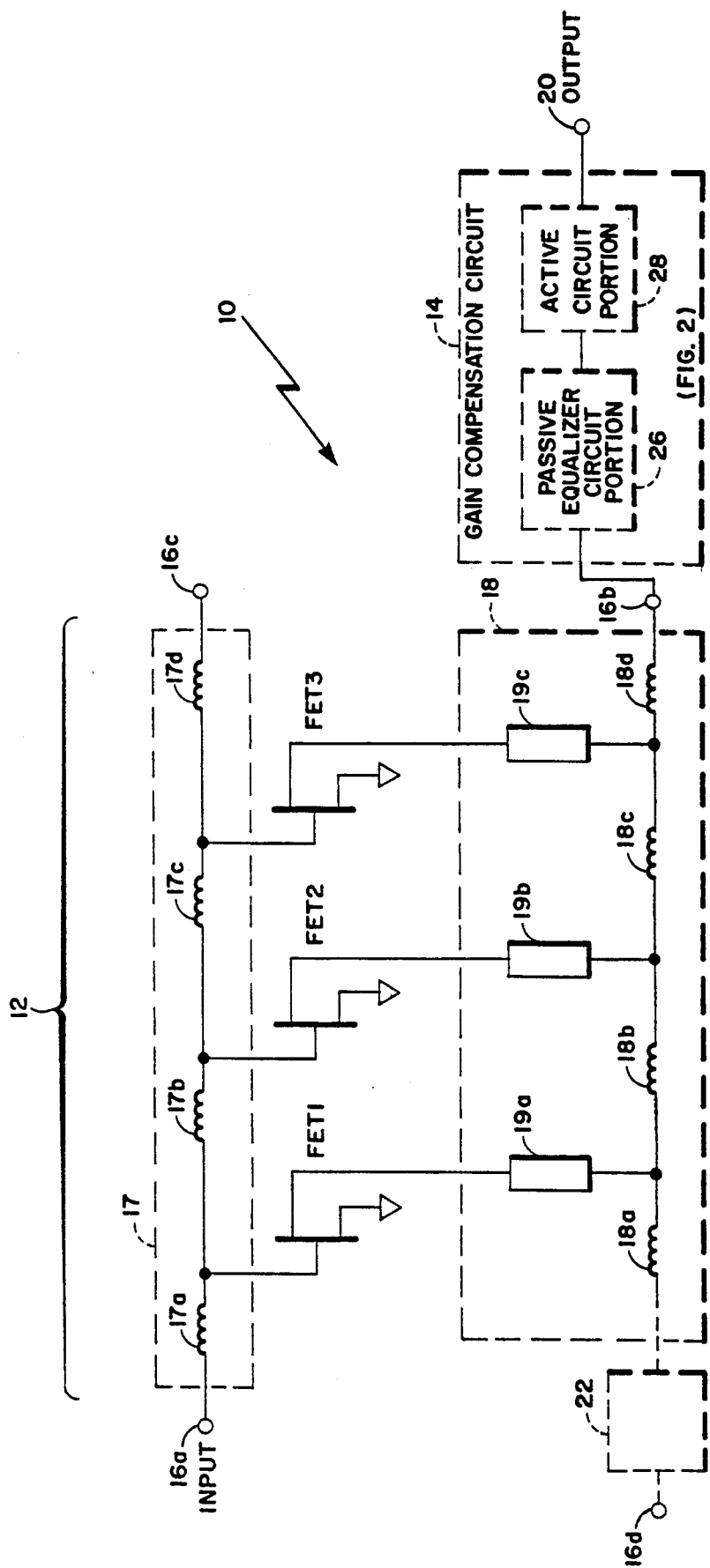
FIG. 1 is a schematic representation of a radio frequency circuit in accordance with the invention.

Referring now to FIG. 1, a radio frequency circuit 10 comprises an amplifier 12 and a series coupled gain compensation circuit 14. The amplifier 12 is shown to include a plurality of field effect transistors FET-1-FET3, with each one of the transistors FET1-FET3 having an input electrode and an output electrode, input propagation means 17 for successively coupling the input electrodes of each one of the transistors FET-1-FET3 to an input terminal 16a of the amplifier 12, and output propagation means 18 for successively coupling the output electrodes of each one of the transistors FET1-FET3 to an output terminal 16b of the amplifier 12 (i.e. terminal 16b may alternatively be referred to as intermediate circuit terminal 16b since such terminal 16b is further coupled to gain compensation circuit 14, the output terminal 20 of which provides the circuit output terminal). The gain compensation circuit 14 here is coupled in series with amplifier 12 so that amplifier 12 precedes the gain compensation circuit 14 in the series coupling between input terminal 16a and output terminal 20. That is, here, amplifier 12 is coupled to input terminal 16a and gain compensation circuit 14 is coupled to output terminal 20. Note, however, that alternatively, amplifier 12 and gain compensation circuit 14 may be arranged so that circuit 14 precedes amplifier 12 in the series coupling between input terminal 16a and output terminal 20. Gain compensation circuit 14 comprises a passive equalizer circuit portion 26 for providing a gain characteristic (i.e. gain versus frequency) having a fixed slope and an active circuit portion 28 for providing a gain characteristic that varies as a function of temperature, as will be described in greater detail in conjunction with FIG. 3.

Referring first to the amplifier 12, here such amplifier 12 is a conventional distributed amplifier 12 having an input terminal 16a, an output terminal 16b (i.e. intermediate circuit terminal 16b), a gate bias terminal 16c, and a drain bias terminal 16d. The input propagation network 17 is comprised of transmission line sections 17a–17d, here provided as sections of high impedance transmission lines coupled between terminals 16a and 16c, as shown. The gate electrodes of the plurality of transistors FET1-FET3 are successively coupled, via the transmission line sections 17a–17d, between the input terminal 16a and the gate bias terminal 16c. Amplifier 12 further includes output propagation network 18 here comprised of transmission line sections 19a–19c and a second plurality of transmission line sections 18a–18d. Transmission line sections 19a–19c are optimally used to couple the drain electrode of each one of the transistors FET1-FET3 to the transmission line sections 18a–18d, as shown. Transmission line sections 18a–18d are successively coupled between a drain bias network 22 and the amplifier output, or circuit intermediate terminal 16b.

In operation of the above-described amplifier 12, a radio frequency signal is fed to input terminal 16a, whereupon it is coupled via the plurality of transistors FET1-FET3 to intermediate circuit terminal 16b. More specifically, a radio frequency signal fed to the input terminal 16a propagates along signal paths provided through each one of the plurality of transistors FET-1-FET3. Output signals from the transistors FET-1-FET3 are added, in-phase, at the intermediate terminal 16b.

Figure 2:
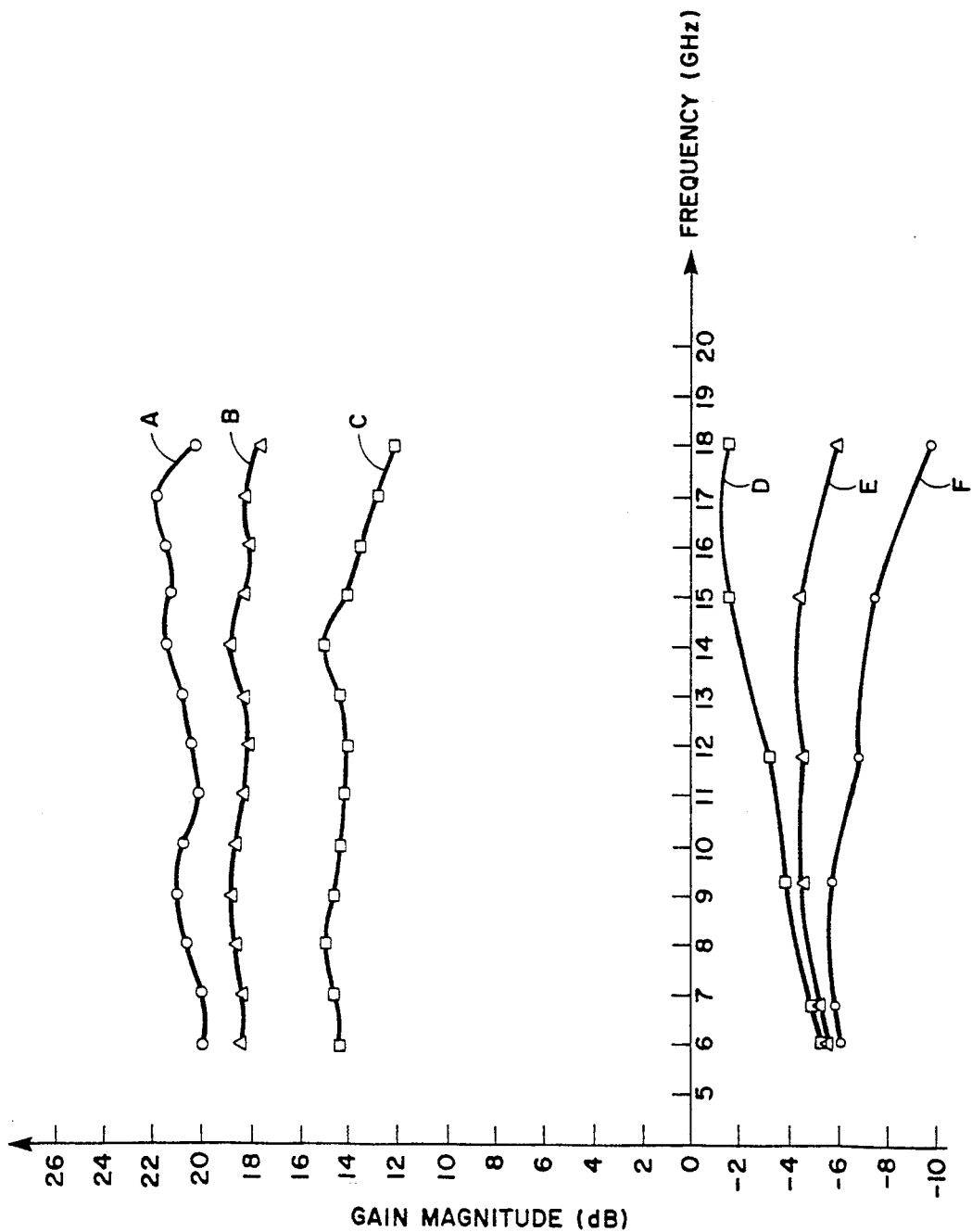
FIG. 2 is a graphical representation of the gain versus frequency characteristic curves of portions of the radio frequency circuit of FIG. 1.

With the above described conventional amplifier 12, the gain characteristic, or more specifically the gain magnitude as a function of frequency, may vary with variations in temperature, as shown in curves A–C of FIG. 2. More specifically, curve A shows the gain characteristic of exemplary amplifier 12 under an operating condition of −55 degrees C., curve B shows such characteristic during room temperature (i.e. +25 degrees C.) operation, and curve C shows the same when amplifier 12 is operated at +115 degrees C. It is noted that gain offset with temperature (i.e. gain varying upward or downward with temperature but being constant over the desired frequency band) is generally acceptable. That is the upward or downward offset of gain with temperature as shown in FIG. 2 for exemplary distributed amplifier 12, is generally acceptable. In fact, there are suitable methods for compensating for the phenomena whereby at −55 degrees C., the gain is centered at approximately 21 dB (see curve A), whereas at +115 degrees C., for example, the characteristic is centered at approximately 14 dB (see curve C). Undesirable, however, is that for a given operating temperature, the gain versus frequency curve associated with amplifier 12 may fluctuate within the desired frequency band rendering the characteristic curve sloped (i.e. with a non-zero slope), again often as a result of temperature fluctuations. For example, at +115 degrees C., the gain fluctuates between approximately 12.5 dB and 15 dB over the frequency band from six to eighteen Gigahertz. It is noted that the gain characteristic of curve A has a positive slope at the higher frequencies (i.e. that the last data point, at approximately eighteen Gigahertz, is inconsistent with this slope is believed to be caused by oscillations of the tested amplifier device 12). Whereas, curve B, showing the device gain characteristic curve at room temperature (i.e. +25 degrees C.) is relatively flat and at the high temperature extreme (+115 degrees C.) such gain characteristic, as shown in curve C, has a negative slope at the higher frequencies.

Here, gain compensation circuit 14 is provided to compensate for such undesirable fluctuations in gain versus frequency occurring over the desired frequency band and which render the gain characteristic sloped, as will be discussed hereinafter. Suffice it here to say however that the amplified signal provided to intermediate terminal 16b is further coupled to passive equalizer circuit portion 26. The output signal of the passive equalizer circuit 26 is fed to the active circuit portion 28 which in turn, provides the output signal of the radio frequency circuit 10 at output terminal 20. With this arrangement, and specifically the series coupling of the passive equalizer portion 26, the active circuit portion 28, and amplifier 12, the individual gain characteristic curves of the series coupled circuit portions 26 and 28 are graphically added with that of the amplifier 12 to provide an overall, or composite, circuit gain versus frequency characteristic. That is, the gain characteristic (i.e. the gain of the circuit output signal provided at output terminal 20) is a composite of the gain characteristics of the amplifier 12, the passive equalizer 26, and the active circuit portion 28. Furthermore, passive equalizer circuit 26 and active circuit portion 28 are designed to compensate for the temperature caused gain variations of amplifier 12 and, thus, to provide a desired, substantially flat composite gain characteristic, as will be discussed hereinafter. The gain characteristic provided by the combination of passive equalizer 26 and active circuit portion 28 (i.e. the gain characteristic associated with gain compensation circuit 14) is shown in FIG. 2, curves D, E, and F for operating temperatures of +115 degrees C., +25 degrees C., and −55 degrees C., respectively.

Figure 3:
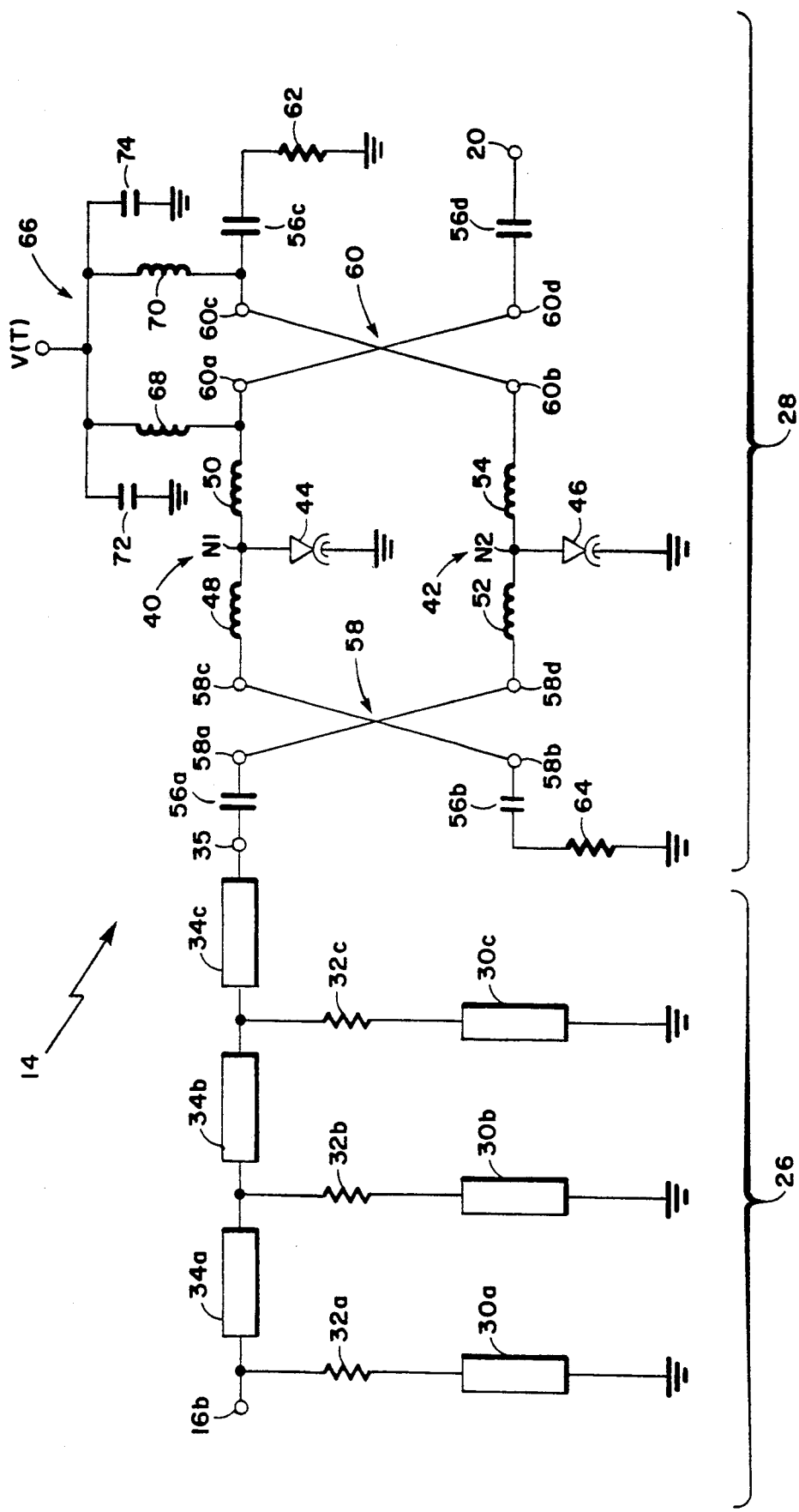
FIG. 3 is a schematic representation of a gain compensation circuit in accordance the invention.

Referring now to FIG. 3, the gain compensation circuit 14 will be described in greater detail. As mentioned, gain compensation circuit 14 is comprised of a passive equalizer circuit portion 26 and an active circuit portion 28. The passive equalizer portion 26 provides a gain characteristic having a fixed slope of gain versus frequency and the active circuit portion 28 has a gain characteristic that varies as a function of temperature. Considering first the passive equalizer circuit portion 26, such portion 26 is shown to include a plurality of open or short circuited shunt stubs 30a-30c, each stub 30a-30c being coupled between a first terminal of a corresponding resistor 32a-32c, respectively, and a reference potential (i.e. here ground). The second terminal of each of resistors 32a-32c is coupled to input terminals of interconnecting transmission line sections 34a-34c, respectively. Interconnecting transmission line sections 34a-34c are serially coupled between intermediate circuit terminal 16b and a terminal 35, as shown.

The impedances and lengths of interconnecting transmission line sections 34a-34c are selected in order to optimize the impedance match of passive equalizer 26 with an RF feed (not shown) which couples an RF input signal to input terminal 16a over the desired frequency band. Furthermore, such impedances and lengths are selected to provide a desired gain characteristic for passive equalizer 26, with the desired gain characteristic being that which compensates the slope of the gain curve of the amplifier 12. Here, the gain of passive equalizer 26 has a positive slope so that varying the impedances and lengths of transmission line sections 34a-34c simply adjusts the magnitude of the slope of such characteristic curve. Here, the desired slope of the gain of the passive circuit portion 26 is equal in magnitude to the negative slope of the characteristic curve of amplifier 12, as occurs in the highest temperature operating conditions, shown by curve C. For example, considering curve C, it is apparent that the desired passive equalizer 26 has a gain characteristic with a positive slope of approximately five dB over the frequency range between six and eighteen GHz. Stated differently, a higher loss is desirable at six GHz and a lower loss at eighteen GHz in order to compensate for the higher values of amplifier 12 gain at six GHz and the dip in the gain thereof at eighteen GHz, as shown in curve C. To provide such a desired gain shape, here, the impedance of line sections 34a-34c is approximately eighty ohms and length of such sections 34a-34c is approximately 115 mils. With the described passive equalizer circuit portion 26, as mentioned, the gain slope is approximately five dB over the frequency band of six to eighteen GHz with a gain of −6 db at the low end (i.e. six GHz) and a gain of −1 db at the high end (i.e. eighteen GHz). Note that in general, once a desired gain shape for passive equalizer 26 is determined (i.e. based on the known frequency response of the amplifier, here distributed amplifier 12, to be compensated) the impedance and length values for transmission line sections 34a-34c may be readily determined by using a conventional computer simulation program for modelling purposes. The program optimizes the component values for the desired response.

Referring now to the active circuit portion 28, it is noted that passive equalizer 26 is here, coupled in series to active circuit portion 28 and precedes such circuit portion 28 in the series connection between the intermediate circuit terminal 16b to the output terminal 20. Stated differently, passive equalizer 26 is coupled to intermediate circuit terminal 16b, whereas active circuit portion 28 is coupled to circuit output terminal 20, as shown. Note, however, that gain compensation circuit 14 may alternatively be arranged with the active circuit portion 28 preceding the passive equalizer circuit portion 26 in the series connection between intermediate circuit terminal 16b and output terminal 20. As shown, terminal 35 of passive equalizer 26 is coupled to active circuit portion 28 via a DC blocking capacitor 56a. Active circuit portion 28 comprises a pair of low pass filters 40, 42, with each such filter 40, 42 including a varactor diode 44, 46, respectively. More specifically, each low pass filter 40, 42 has a pair of inductors 48, 50 and 52, 54, respectively, coupled to a common circuit node N1 and N2, respectively, with the corresponding varactor diode 44, 46 being coupled between such node N1, N2 and a reference potential, as shown. Varactor diodes 44, 46 may be any conventional abrupt junction tuning diodes such as varactor diodes sold under the product number CVE 7800B by Alpha Industries. Low pass filters 40, 42 in turn are coupled between a pair of three dB hybrids 58, 60. Here, hybrids 58, 60 are conventional three dB Lange couplers and are provided to improve the impedance match between the circuit portions 26 and 28. More specifically, radio frequency energy reflected from the varactor diodes 44, 46 which would otherwise degrade the impedance match is, here, recombined by hybrids 58 and 60 to improve such match.

Hybrid 58 has terminals 58a–58d, with terminal 58a coupled to DC blocking capacitor 56a and terminal 58b coupled to a second DC blocking capacitor 56b. Terminal 58c of hybrid 58 is coupled to inductor 48 and terminal 58d thereof is coupled to inductor 52, as shown. Hybrid 60 similarly has terminals 60a and 60b coupled to inductors 50 and 54, respectively. Terminal 60c of hybrid 60 is coupled to DC blocking capacitor 56c and terminal 60d is coupled to DC blocking capacitor 56d, the other terminal of which is coupled to output terminal 20, as shown. Blocking capacitors 56b, 56c are terminated by fifty ohm resistors 62, 64, respectively, as shown.

A bias circuit 66, for providing a bias voltage to varactor diodes 44, 46 comprises a pair of inductors 68, 70, DC blocking capacitors 72, 74, and has a terminal V(T) adapted for coupling to an external voltage source providing a voltage V(T). External supplied voltage V(T) varies in accordance with temperature. More particularly, voltage V(T) is controlled by a temperature sensitive resistor, or thermistor. Here, inductors 68, 70 and DC blocking capacitors 72, 74 operate as low pass filters, to prevent radio frequency energy from being passed to the external voltage source providing voltage V(T). Here also, voltage V(T) is provided by the output of an operational amplifier (not shown), the inverting input of which is fed by a constant voltage source and the gain of which varies with temperature. Specifically, a thermistor is coupled between the constant voltage source and the inverting input of the operational amplifier. Here, the thermistor has a resistance that increases with increasing temperature. With this arrangement, as the temperature decreases (and the thermistor resistance decreases), the operational amplifier output voltage V(T) increases; whereas, when the temperature increases (and the thermistor resistance increases), the operational amplifier output voltage V(T) decreases.

In operation, the varactor diodes 44, 46 act as variable capacitors, with the capacitance thereof varying as a function of the bias voltage V(T) provided by bias circuit 66. Thus, low pass filters 40, 42 are each comprised of a pair of series inductors 48, 50 and 52, 54 and a shunt varactor diode 44, 46, respectively, simulating a shunt capacitor. The values of the inductors 48, 42 and 52, 54 are selected in order to provide relatively low insertion loss of the corresponding low pass filter 40, 42, respectively, when the capacitance of the corresponding varactor diode 44, 46 is at its lowest value. Here, inductors 48, 50 and 52, 54 have an inductance value of approximately twelve nanoHenrys. Moreover, here, the varactors 44, 46 are biased to their lowest value of capacitance at the highest temperature extreme, by means of a negative bias voltage V(T) of −12 volts. With this arrangement, at the highest temperature extreme, the composite circuit gain will follow the shape of the gain characteristic of the passive equalizer portion 26. That is, under such a high temperature conditions, when the value of the capacitance of varactors 44, 46 is at its lowest, low pass filters 40, 42, and thus, active circuit portion 28, has a negligible effect on the overall circuit 10 gain. The gain characteristic of the combination of passive equalizer 26 and active circuit portion 28 at an operating temperature of approximately +115 degrees C. (i.e. the gain characteristic of gain compensation circuit 14) is shown in FIG. 2, curve D. The positive slope of curve D corresponds in magnitude to the negative slope of passive equalizer 26. This is because the gain of active circuit portion 28 is substantially flat for such high temperature operation. Thus, the composite gain characteristic of circuit 10 at +115 degrees C. (not shown) is provided by the graphical addition of curves C and D, associated with amplifier 12 and gain compensation circuit 14, respectively, and is substantially flat. The reason that varactor diodes 44, 46 are so biased (i.e. in such a way as to provide minimum capacitance under high temperature operating conditions) is because it is recognized that the gain of amplifier 12 desired to be compensated has an undesirable negative slope under such conditions (i.e. as shown in FIG. 2, curve C). Stated differently, because of the negative tilt or slope of curve C, it is desirable to offset such slope with the positive slope of the passive equalizer circuit portion 26.

When operating at relatively cold temperatures (such as −55 degrees C.), on the other hand, the varactor 44, 46 capacitance is set to its maximum value by the bias voltage V(T) provided by bias circuit 66 being equal to approximately zero volts. Under such cold operating conditions, it is noted that the gain characteristic of the passive circuit portion 26 remains fixed with the positive slope, as described above. However, it is further noted that the varactor 44, 46 junction capacitance is increased as a function of the temperature decreasing (i.e. due to the increased bias voltage V(T) resulting from such decreased temperature). The effect of the increased varactor 44, 46 capacitance is that the cutoff frequency of the low pass filters 40, 42 decreases. Moreover, as the cutoff frequency of the low pass filters 40, 42 decreases, the insertion loss of the active circuit portion 28 increases with increasing frequency. That is, the gain characteristic of the active circuit portion has a negative slope. In fact, here, the slope of the gain characteristic of the active circuit portion 28 is approximately −10 dB over the frequency range between six and eighteen GHz of so that the composite gain of the passive equalizer 26 and active circuit portion 28 is negative with a slope of approximately −4 dB over the same frequency range. The gain characteristic provided by the combination of the active circuit portion 28 and the passive equalizer 26 at an operating condition of −55 degrees C. is shown in FIG. 2, curve F. With this arrangement, the positive slope of the gain of amplifier 12 at such low operating temperature (see Curve A, FIG. 2), is compensated by the negative slope of the gain of compensation circuit 14 (see curve F) to provide an overall gain characteristic (not shown) of circuit 10 that is substantially flat.

Having described preferred embodiments of the invention, it will now become apparent to one of skill in the art that other embodiments incorporating their concepts may be used. For example, it may be desirable to provide a passive equalizer 26 having a negative slope in which case the varactor diodes 44, 46 would be biased to their lowest capacitance values under at the lowest operating temperature. That is, with such an arrangement, one would design the passive equalizer to compensate for the positive slope of amplifier 12 gain (as occurs during operation at low temperatures, such as is shown by curve A) at which conditions the effect of the active circuit portion 28 would be negligible. It is felt, therefore, that these embodiments should not be limited to disclosed embodiments, but rather should be limited only by the spirit and scope of the appended claims.

What is claimed is:

1. A radio frequency circuit comprising:

a) at least one field effect transistor having an input electrode and an output electrode; and
b) gain compensation means coupled in series with the at least one field effect transistor, said gain compensation means comprising:
   (i) first means for providing a gain versus frequency characteristic having a fixed slope; and
   (ii) second means, coupled in series with the first means and comprising a varactor diode, for providing a varying gain versus frequency characteristic in response to variations in temperature.

2. The radio frequency circuit recited in claim 1 further comprising means for providing a bias voltage to the varactor diode, wherein said bias voltage varies with temperature.

3. The radio frequency circuit recited in claim 1 wherein said first means comprises a transmission line network.

4. The radio frequency circuit recited in claim 3 wherein said fixed slope is positive.

5. The radio frequency circuit recited in claim 1 further comprising an input terminal and an output terminal, wherein said gain compensation means is coupled in series with said at least one field effect transistor between said input terminal and said output terminal, and wherein said at least one field effect transistor is coupled to said input terminal and said gain compensation means is coupled to said output terminal.

6. A radio frequency circuit comprising:
a) amplifying means comprising at least one field effect transistor;
b) a transmission line network, disposed in series with said amplifying means, said network comprising a plurality of transmission lines arranged to provide a gain characteristic having a fixed slope;
c) means, disposed in series with said transmission line network and including a varactor diode for providing a variable gain characteristic in accordance with temperature variations.

7. The radio frequency circuit recited in claim 6 wherein said amplifying means comprises:
a) a plurality of field effect transistors, each one of said transistors having an input electrode and an output electrode;
b) input propagation means for successively coupling the input electrodes of each one of said transistors to an input terminal of said radio frequency circuit;
c) output propagation means for successively coupling the output electrodes of each one of said transistors to an intermediate terminal of said circuit.

8. The radio frequency recited in claim 6 wherein said transmission line network provides a gain characteristic having a positive slope.

9. The radio frequency circuit recited in claim 6 further comprising means for providing a bias voltage to said varactor diode, wherein said bias voltage varies with temperature.

10. A distributed amplifier circuit comprising:
a) a plurality of field effect transistors, each one of said transistors having an input electrode and an output electrode;
b) input propagation means for successively coupling the input electrodes of each one of said transistors to an input terminal of said distributed amplifier circuit;
c) output propagation means for successively coupling the output electrodes of each one of said transistors to an intermediate terminal of said circuit; and
d) gain compensation means, disposed between said intermediate terminal and an output terminal of said amplifier, said gain compensation means comprising:
   (i) first means for providing a gain versus frequency characteristic having a fixed slope; and
   (ii) second means comprising a varactor diode for providing a varying gain versus frequency characteristic in response to variations in temperature.

11. The distributed amplifier circuit recited in claim 10 further comprising means for providing a bias voltage to the varactor diode, wherein said bias voltage is varies with temperature.

12. A method for compensating for temperature caused gain variations in an amplifier, said method comprising the steps of:
a) providing first means having a gain versus frequency characteristic with a fixed slope;
b) providing second means having a varying gain versus frequency characteristic in response to variations in temperature, said second means comprising a varactor diode; and
c) coupling said first means, said second means, and said amplifier in series.

13. The method recited in claim 12 wherein said step of providing said first means includes the step of providing a transmission line network having a gain versus frequency characteristic with a positive slope.

14. The method recited in claim 12 further comprising the step of providing a bias voltage to the varactor diode, wherein said bias voltage varies with temperature.

15. The method recited in claim 12 wherein said amplifier further comprising the step of coupling said first means, said second means, and said amplifier in series between an input terminal and an output terminal of said amplifier, wherein said amplifier is coupled to said input terminal and said second means is coupled to said output terminal.

* * * * *